US009983424B2

(12) United States Patent
Kim et al.

(10) Patent No.: US 9,983,424 B2
(45) Date of Patent: May 29, 2018

(54) FOLDABLE DISPLAY DEVICE

(71) Applicant: LG DISPLAY CO., LTD., Seoul (KR)

(72) Inventors: Tae-Woo Kim, Paju-si (KR); Gee-Sung Chae, Incheon (KR); Joo-Hye Park, Anyang-si (KR); Noh-Jin Myung, Paju-si (KR); Seung-Hee Lee, Goyang-si (KR); Sang-Hak Shin, Goyang-si (KR); Tae-Hyeong Kwak, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/175,702

(22) Filed: Jun. 7, 2016

(65) Prior Publication Data

US 2016/0357052 A1   Dec. 8, 2016

(30) Foreign Application Priority Data

Jun. 8, 2015   (KR) .................. 10-2015-0080871
May 26, 2016   (KR) .................. 10-2016-0064898

(51) Int. Cl.
| H01L 27/14 | (2006.01) |
| G02F 1/1333 | (2006.01) |
| H01L 51/00 | (2006.01) |
| H01L 51/52 | (2006.01) |
| H01L 27/32 | (2006.01) |
| G02F 1/1368 | (2006.01) |

(52) U.S. Cl.
CPC .. *G02F 1/133305* (2013.01); *G02F 1/133308* (2013.01); *H01L 51/0097* (2013.01); *H01L 51/5237* (2013.01); *G02F 1/1368* (2013.01); *G02F 2001/133314* (2013.01); *G02F 2201/121* (2013.01); *G02F 2202/02* (2013.01); *H01L 27/3244* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| 2014/0065326 A1* | 3/2014 | Lee | ............................ G06F 1/16 |
| | | | 428/12 |
| 2014/0232956 A1* | 8/2014 | Kwon | ............... G02F 1/133305 |
| | | | 349/12 |
| 2015/0382446 A1* | 12/2015 | Kwon | .................... H05K 1/028 |
| | | | 174/251 |

* cited by examiner

*Primary Examiner* — Cory Eskridge
(74) *Attorney, Agent, or Firm* — Dentons US LLP

(57) ABSTRACT

A foldable display device comprises a display panel; and a backplate on a surface of the display panel, the backplate including a folding region and unfolding regions at both sides of the folding region, the backplate including at least two opening patterns in the folding region that are different from each other.

27 Claims, 17 Drawing Sheets

10

100

110

FOLDABLE DISPLAY DEVICE

The present application claims the benefit of Korean Patent Application No. 10-2015-0080871 filed in Korea on Jun. 8, 2015, and Korean Patent Application No. 10-2016-0064898 filed in Korea on May 26, 2016, all of which are hereby incorporated by reference for all purposes as if fully set forth herein.

BACKGROUND OF THE INVENTION

Field of the Invention

The present invention relates to a foldable display device and a method of manufacturing the same. More particularly, the present invention relates to a foldable display device with improved reliability.

Discussion of the Related Art

As information technology and mobile communication technology have been developed, a display device being capable of displaying a visual image has also been developed. Flat panel display devices, such as a liquid crystal display (LCD) device and an organic light emitting display (OLED) device, are developed and used.

In general, an LCD device includes a liquid crystal panel, which includes upper and lower substrates and a liquid crystal layer therebetween. The liquid crystal layer is driven by an electric field induced between a pixel electrode and a common electrode to display images.

An OLED device includes an organic emitting diode which includes an anode, a cathode and an organic emitting layer therebetween. In the organic emitting diode, holes and electrodes respectively from the anode and the cathode are combined such that light is emitted from the organic emitting layer to display images.

Recently, a foldable display device, which is fabricated by using a flexible substrate, is in demand. The foldable display device is folded to be portable and is unfolded to display images. Namely, with the foldable display device, a large-sized image display can be provided, and portability of the display device is improved.

FIG. 1 is a schematic cross-sectional view of a foldable display device according to the related art.

As shown in FIG. 1, the foldable display device 10 includes a display panel 20, a backplate 30 and a cover window 40.

The display panel 20 includes a flexible substrate 22, a display part 24 on the flexible substrate 22. For example, the flexible substrate 22 may be a polyimide substrate.

When the display panel 20 is an organic emitting diode panel, the display part 24 may include an organic emitting diode and a thin film transistor (TFT) for driving the organic emitting diode. The organic emitting diode may include an anode, which is connected to the TFT, an organic emitting layer on the anode, and a cathode on the organic emitting layer. In addition, an encapsulation film for preventing moisture penetration may cover the organic emitting diode.

On the other hand, when the display panel 20 is a liquid crystal panel, the display part 24 may include a thin film transistor (TFT) on the flexible substrate 22, a pixel electrode, which is connected to the TFT, a counter substrate, which faces the flexible substrate 22, a common electrode, which is on the flexible substrate 22 or the counter substrate, and a liquid crystal layer between the flexible substrate 22 and the counter substrate. The display panel 20 may further include a backlight unit.

With a carrier substrate (not shown) attached to a lower surface of the flexible substrate 22, elements such as the TFT are formed on the flexible substrate 22, and the carrier substrate is released to obtain the flexible display panel 20.

In the flexible display panel 20, since the flexible substrate 22 is thin, the backplate 30 for supporting the display panel 20 is disposed under the flexible substrate 22. For example, the backplate 30 may be formed of polyethylene terephthalate (PET) and may be attached to the display panel 20 by an adhesive layer 32.

The cover window 40 is attached to an upper side of the display panel 20. The damage on the display panel 20 from outer impacts is prevented by the cover window 40. Although not shown, the cover window 40 may be attached to the display panel 20 by an adhesive layer.

In the related art foldable display device, the PET film having about 100 micrometers is used for the backplate 30. When the folding and unfolding operation is repeated in the foldable display device 10, plastic deformation occurs in the backplate 30 such that the restoration of the folded display device to its original configuration may become difficult.

Namely, as shown in FIGS. 2A and 2B, since there is a plastic deformation problem in the backplate 30 (of FIG. 1) of the PET film, there may be limitations in the folding and unfolding operation of the foldable display device 10. Namely, the folding and unfolding characteristics of the foldable display device 10 deteriorate. FIG. 2A illustrates that the backplate 30 is deformed and does not revert to its original shape when external force is removed. In FIG. 2B shows a result of plastic deformation of the backplate 30 after a repeated folding and unfolding where a center portion is plastic deformed downward and two wing portions are plastic deformed upward.

By reducing a thickness of the backplate 30, the plastic deformation problem in the backplate 30 may be decreased. However, the elastic restoring energy of the backplate 30 having such a reduced thickness may be decreased and the time for restoring the folded display device to its original state may also be increased.

SUMMARY OF THE INVENTION

Accordingly, the present invention is directed to a foldable display device and a method of manufacturing the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a foldable display device may include, for example, a display panel; and a backplate on a surface of the display panel, the backplate including a folding region and unfolding regions at both sides of the folding region, the backplate including at least two opening patterns in the folding region that are different from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings.

Figure 1:
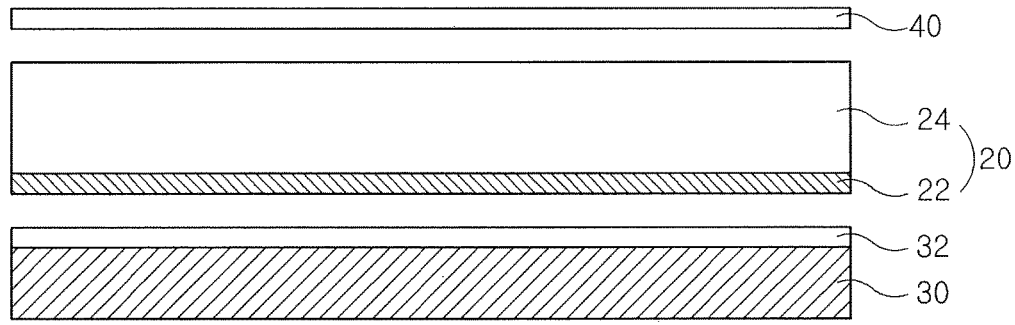
FIG. 1 is a schematic cross-section view of the related art foldable display device.
Figure 2A:
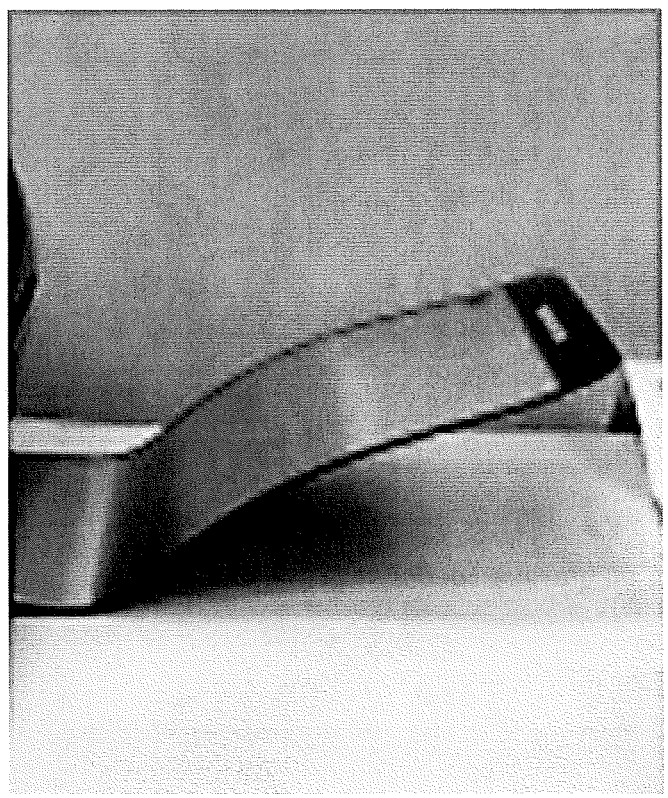
FIGS. 2A and 2B are views showing the plastic deformation issue in the related art backplate.
Figure 2B:
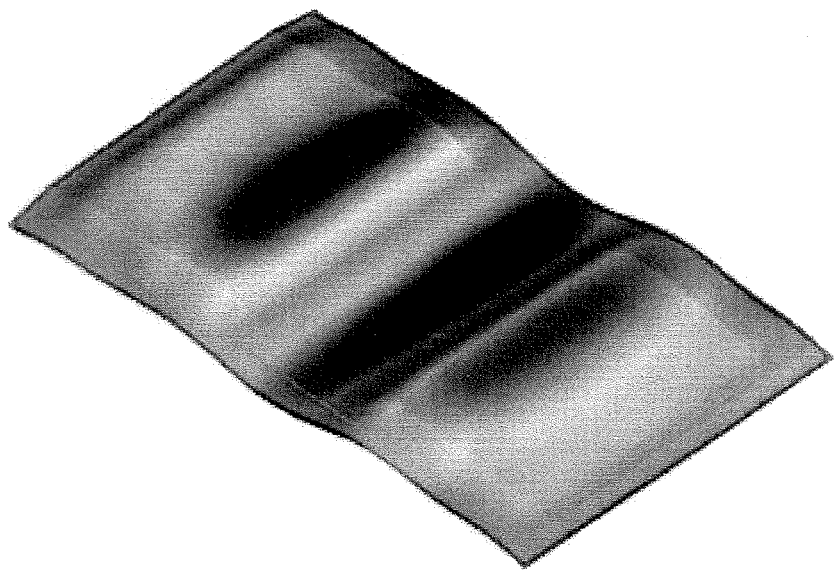
Figure 3:
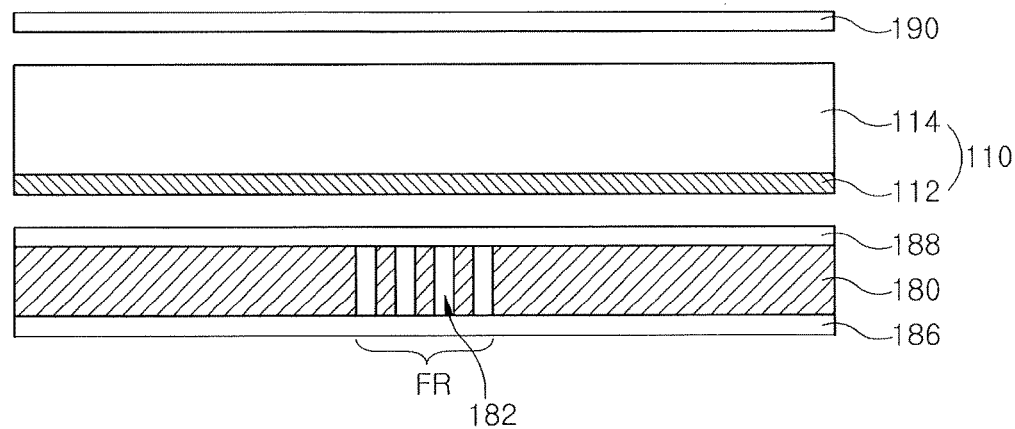
FIG. 3 is a schematic cross-sectional view of a foldable display device according to an embodiment of the present invention.

FIG. 3 is a schematic cross-sectional view of a foldable display device according to an embodiment of the present invention.

As illustrated in FIG. 3, a foldable display device 100 according to an embodiment of the present invention includes a display panel 110, a backplate 180, which is disposed under the display panel 110 and includes at least two opening patterns 182 in a folding region FR, and a cover window 190 disposed on the display panel 110. Namely, the backplate 180 includes two or more holes in the folding region FR.

The display panel 110 includes a flexible substrate 112 and a display part 114 on the flexible substrate 112. For example, the flexible substrate 112 may be a polyimide substrate.

A process of forming the display part 114 is performed on the flexible substrate 112 attached to a carrier substrate (not shown) such as a glass substrate. After the process of forming the display part 114, the carrier substrate and the flexible substrate 112 are separated or released to obtain the display panel 110.

Figure 4A:
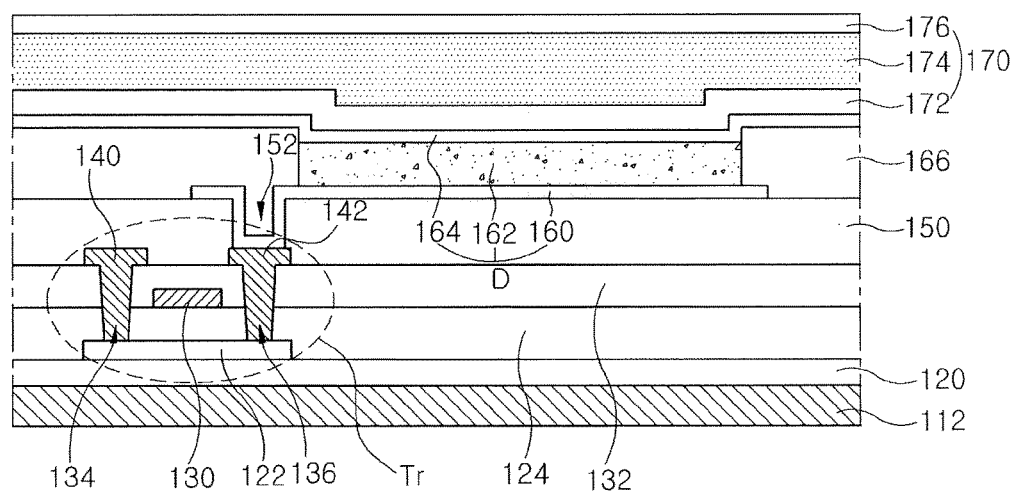
FIGS. 4A and 4B are schematic cross-sectional views of display panels for a foldable display device according to embodiments of the present invention.
Figure 4B:
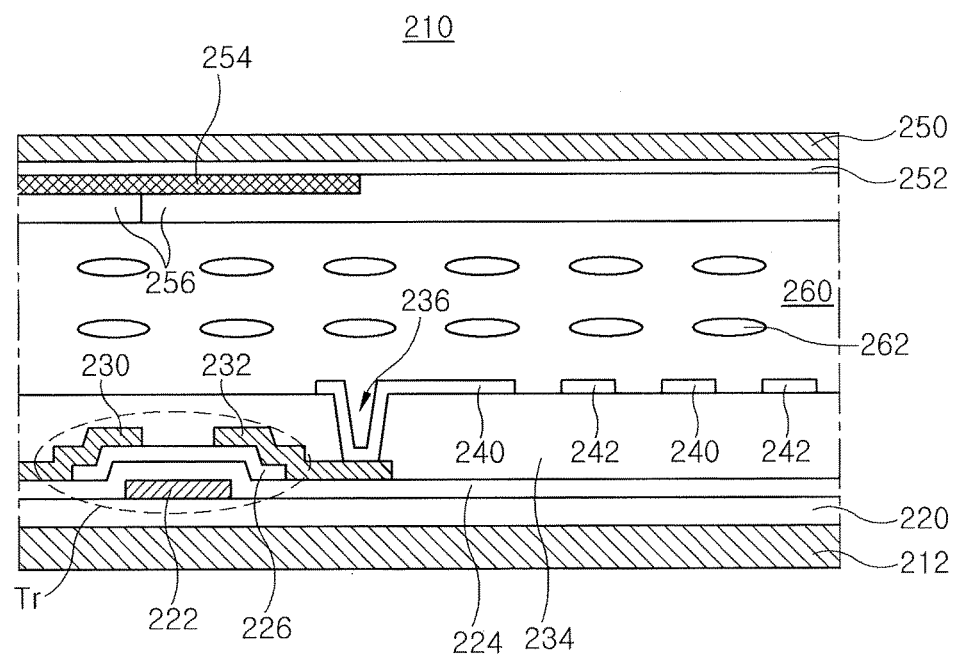

FIGS. 4A and 4B are schematic cross-sectional views of display panels for a foldable display device according to embodiments of the present invention.

As illustrated in FIG. 4A, the display panel 110 may be an organic emitting diode panel.

A buffer layer 120 is formed on the flexible substrate 112, and a thin film transistor (TFT) Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be reduced or prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 4A, the gate insulating layer 124 is formed on the entire surface of the flexible substrate 112. Alternatively, the gate insulating layer 124 may be patterned to have the same shape as the gate electrode 130.

An interlayer insulating layer 132, which is formed of an insulating material, is formed on an entire surface of the flexible substrate 112 including the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

In FIG. 4A, the first and second contact holes 134 and 136 extend into the gate insulating layer 124. Alternatively, when the gate insulating layer 124 is patterned to have the same shape as the gate electrode 130, there may be no first and second contact holes 134 and 136 in the gate insulating layer 124.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr, and the TFT Tr serves as a driving element.

In FIG. 4A, the gate electrode 130, the source electrode 140 and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the flexible substrate 112 and cross each other to define a pixel region. In addition, a switching element, which is electrically connected to the gate line and the data line, may be disposed on the flexible substrate 112. The switching element is electrically connected to the TFT Tr as the driving element.

In addition, a power line, which is parallel to and spaced apart from the gate line or the data line, may be formed on or over the flexible substrate 112. Moreover, a storage capacitor for maintaining a voltage of the gate electrode 130 of the TFT Tr during one frame, may be further formed on the flexible substrate 112.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the display panel 110 is operated in a top-emission type, a reflection electrode or a reflection layer may be formed under the first electrode 160. For example, the reflection electrode or the reflection layer may be formed of aluminum-paladium-copper (APC) alloy.

A bank layer 166, which covers edges of the first electrode 160, is formed on the passivation layer 150. A center of the first electrode 160 in the pixel region is exposed through an opening of the bank layer 166.

An organic emitting layer 162 is formed on the first electrode 160. The organic emitting layer 162 may have a single-layered structure of an emitting material layer formed of an emitting material. Alternatively, to improve emitting efficiency, the organic emitting layer 162 may have a multi-layered structure including a hole injection layer, a hole transporting layer, the emitting material layer, an electron transporting layer and an electron injection layer sequentially stacked on the first electrode 160.

A second electrode 164 is formed over the flexible substrate 112 including the organic emitting layer 162. The second electrode 164 is positioned at an entire surface of the display area. The second electrode 164 may be a cathode and may be formed of a conductive material having a relatively low work function. For example, the second electrode 164 may be formed of aluminum (Al), magnesium (Mg) or Al—Mg alloy.

The first electrode 160, the organic emitting layer 162 and the second electrode 164 constitute the organic emitting diode D.

An encapsulation film 170 is formed on the organic emitting diode D to prevent penetration of moisture into the organic emitting diode D.

The encapsulation film 170 may have has a triple-layered structure of a first inorganic layer 172, an organic layer 174 and a second inorganic layer 176. However, it is not limited thereto.

A polarization plate (not shown) may be disposed on the encapsulation film 170 to reduce an ambient light reflection. The polarization plate may be a circular polarization film.

On the other hand, as illustrated in FIG. 4B, a liquid crystal panel 210 may be used for the display panel 110.

The liquid crystal panel 210 includes first and second flexible substrates 212 and 250, which face each other, and a liquid crystal layer 260, which includes liquid crystal molecules 262, therebetween.

A first buffer layer 220 is formed on the first flexible substrate 212, and a TFT Tr is formed on the first buffer layer 212. The first buffer layer 220 may be omitted.

A gate electrode 222 is formed on the first buffer layer 220, and a gate insulating layer 224 is formed on the gate electrode 222. In addition, a gate line (not shown), which is connected to the gate electrode 222, is formed on the first buffer layer 220.

A semiconductor layer 226, which corresponds to the gate electrode 222, is formed on the gate insulating layer 224. The semiconductor layer 226 may include an oxide semiconductor material. Alternatively, the semiconductor layer may include an active layer of intrinsic amorphous silicon and an ohmic contact layer of impurity-doped amorphous silicon.

A source electrode 230 and a drain electrode 232, which are spaced apart from each other, are formed on the semiconductor layer 226. In addition, a data line (not shown), which is electrically connected to the source electrode 230 and crosses the gate line to define a pixel region, is formed.

The gate electrode 222, the semiconductor layer 226, the source electrode 230 and the drain electrode 232 constitute the TFT Tr.

A passivation layer 234, which includes a drain contact hole 236 exposing the drain electrode 232, is formed on the TFT Tr.

A pixel electrode 240, which is connected to the drain electrode 232 through the drain contact hole 236, and a common electrode 242, which is alternately arranged with the pixel electrode 240, are formed on the passivation layer 234.

A second buffer layer 252 is formed on the second flexible substrate 250, and a black matrix 254, which shields a non-display region such as the TFT Tr, the gate line and the data line, is formed on the second buffer layer 252. In addition, a color filter layer 256, which corresponds to the pixel region, is formed on the second buffer layer 252. The second buffer layer 252 and the black matrix 254 may be omitted.

The first and second flexible substrates 212 and 250 are attached with the liquid crystal layer 260 therebetween. The liquid crystal molecules 262 of the liquid crystal layer 260 is driven by an electric field between the pixel and common electrode 240 and 242.

Although not shown, first and second alignment layers may be formed over the first and second flexible substrates 212 and 250 to be adjacent to the liquid crystal layer 260. In addition, first and second polarization plates, which have perpendicular transmission axes, may be attached to an outer side of each of the first and second flexible substrates 212 and 250. Moreover, a flexible backlight unit may be disposed under the first flexible substrate 212 to provide light.

Referring again to FIG. 3, the backplate 180 is disposed under the display panel 110 such that the display panel 110 is supported by the backplate 180. For example, the backplate 180 may be attached to the flexible substrate 112 using an adhesive layer (not shown).

The backplate 180 has a high stiffness than the flexible substrate 112. Namely, the backplate 180 has a Young's modulus value (i.e., elastic modulus value) larger than the flexible substrate 112.

For example, the backplate 180 may be formed of a metal (e.g., stainless-steel (SUS)) or a polymer (e.g., polymethylmetacrylate (PMMA), polycarbonate (PC), polyacrylate (PA), polyvinylalcohol (PVA), acrylonitrile-butadiene-styrene (ABS), polyethylene terephthalate (PET)).

When the backplate 180 is formed of a high stiffness material, e.g., SUS, the backplate 180 has a high restoring force. Accordingly, a thickness of the backplate 180 can be reduced. In addition, since the backplate 180 of the high stiffness material has a desired stiffness with a relatively low thickness, the display panel 110 is sufficiently supported by the backplate 180. Moreover, there is no the plastic deformation problem in the backplate 180 by reducing the thickness.

However, when the backplate 180 is formed of a high stiffness material, an elastic deformation region becomes narrow such that that the restoration of the folded display device to its original configuration becomes difficult. Namely, the foldable display device maintains the folding configuration even if the foldable display device is unfolded. In other words, a time from the folding configuration to its original configuration is increased.

In the foldable display device 100 according to an embodiment of the present invention, since the backplate 180 includes at least two opening patterns (or holes) 182 at the folding region FR, the elastic deformation region of the backplate 180 is enlarged or expanded. The opening patterns 182 at the folding region FR serves as a spring such that the restoration characteristic of the backplate 180 is improved. Accordingly, the problem in the time from the folding configuration to its original configuration by reducing the thickness of the backplate 180.

In other words, since the backplate 180 is formed of a high stiffness material, the restoration characteristic of the backplate 180 is increased. In addition, due to the opening patterns 182, the elastic deformation region of the backplate 180 is expanded. Accordingly, the backplate 180 has a relatively small thickness (e.g., about 2 mm), and the folding property (or characteristic) of the foldable display device 100 is improved.

On the other hand, an image defect may occur by the opening patterns 182 of the backplate 180. To prevent the image defect problem and protect the opening patterns 182, first and second step compensation layers 186 and 188 may be formed on opposite sides of the backplate 180, respectively. Namely, the first step compensation layer 186 is formed on a rear surface of the backplate 180, and the second step compensation layer 188 is formed on a front surface of the backplate 180. As a result, the backplate 180 is positioned between the display panel 110 and the first step compensation layer 186, and the second step compensation layer 188 is positioned between the display panel 110 and the backplate 180. In addition, the first and second step compensation layers 186 and 188 may have stress compensation function for the backplate 180.

Each of the first and second step compensation layers 186 and 188 is formed of a material having a low stiffness than the backplate 180. For example, each of the first and second step compensation layers 186 and 188 may be formed of one of polyurethane (PU), thermoplastic polyurethane (TPU), polyacrylate, rubber and silicon (Si).

The first and second step compensation layers 186 and 188 cover and protect the opening patterns 182, and the step by the opening patterns 182 is removed by the first and second step compensation layers 186 and 188. Accordingly, the image defect resulted from the step of the opening patterns 182 is prevented.

One or both of the first and second step compensation layers 186 and 188 may be omitted. FIG. 3 illustrates the first and second step compensation layers 186 and 188 covering an entire surface of the backplate 180. Alternatively, each of the first and second step compensation layers 186 and 188 may be formed in the folding region FR except the unfolding region. In addition, one of the first and second step compensation layers 186 and 188 may be formed to fill a space of the opening patterns 182.

The cover window 190 protects the display panel 110 from outer impacts and prevents damages (e.g., scratches) on the display panel 110. The cover window 190 may be omitted.

Although not shown, a touch panel may be disposed between the display panel 110 and the cover window 190.

As explained above, in the foldable display device 100 including a high stiffness backplate 180, the backplate 180 has reduced thickness. In addition, since the opening patterns 182 serving as the spring is formed in the folding region FR, the restoration force of the high stiffness backplate is increased. Namely, the backplate 180 having a relatively small thickness and a high restoration force is provided. Accordingly, the foldable display device 100 having excellent folding/unfolding properties and a thin profile can be provided.

FIGS. 5A to 5D are schematic plane views of backplates for a foldable display device according to an embodiment of the present invention.

Figure 5A:
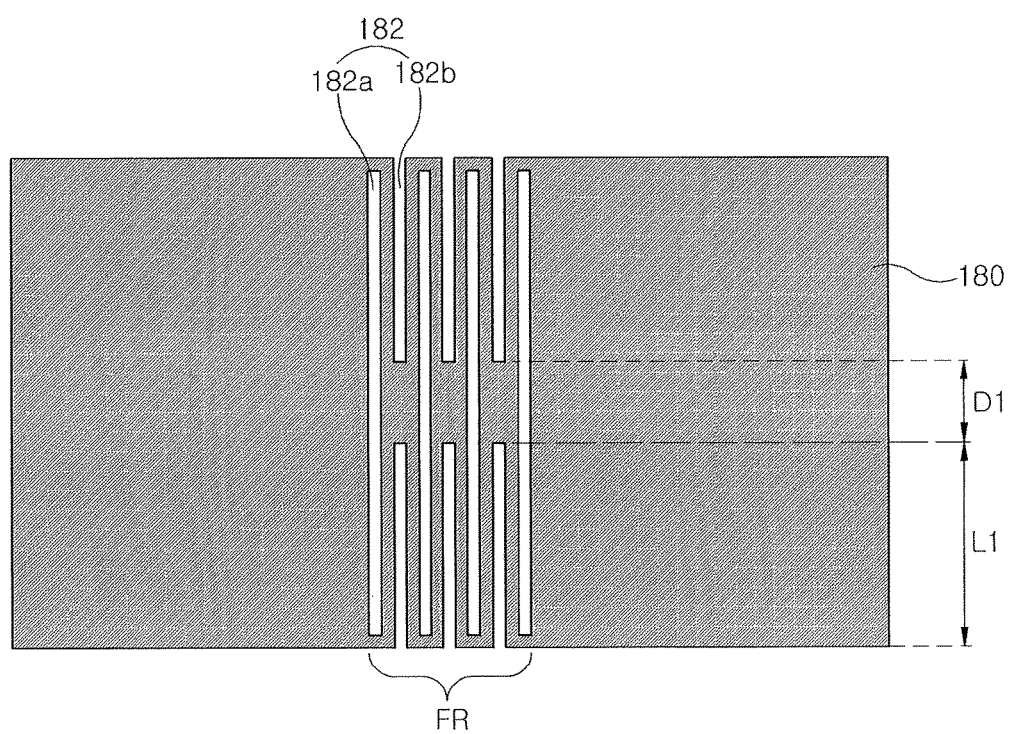
FIGS. 5A to 5D are schematic plane views of backplates for a foldable display device according to the embodiment of the present invention.

As illustrated in FIG. 5A, in the folding region FR of the backplate 180, the opening pattern 180 including a first pattern 182a arranged in a (2n−1)th row (e.g., an odd row) and a second pattern 182b arranged in a (2n)th row (e.g., an even row) is formed. (n is a positive integer)

In FIG. 5A, the folding region FR is positioned at a center of the backplate 180. However, a position of the folding region FR is not limited. In addition, at least two folding regions FR may be defined.

Each of the first and second patterns 182a and 182b has a rectangular shape. A space between adjacent two second patterns 182b in the (2n)th row may correspond to the first pattern 182a in the (2n−1)th row.

Both ends of the first pattern 182a may be positioned in the folding region FR, while an end of the second pattern 182b may be positioned at an edge of the backplate 180 in the folding region FR.

Namely, a side of the backplate 180 may be discontinuous in the (2n)th row (or (2n−1)th row). In the folding region FR, the side of the backplate 180 is connected by a portion between the first and second patterns 182a and 182b and a portion between adjacent two second patterns 182b in one row such that the folding region FR has the spring-like function.

In FIG. 5A, one first pattern 182a is formed in each odd row, and two second patterns 182b are formed in each even row. However, there is no limitation to the number of the first and second patterns 182a and 182b. For example, at least two first patterns 182a may be formed in each odd row, and at least three second patterns 182b may be formed in each even row.

Each of the first and second patterns 182a and 182b is formed to extend along the row direction. Namely, each of the first and second patterns 182a and 182b has a major axis along the row direction.

In addition, adjacent two of the second patterns 182b are separated by a first distance D1 along the row direction has a first length (i.e., the major axis) L1. The first distance D1 is equal to or smaller than the first length L1. It is preferred that the first distance D1 is smaller than the first length L1.

Accordingly, the backplate 180 in folding region FR, where the opening pattern 182 is formed, has a spring-like function in the unfolding operation such that an elastic restoration energy of the backplate 180 can be increased. Accordingly, the unfolding speed of the foldable display device 100 can be increased and/or the unfolding time can be decreased.

Figure 5B:
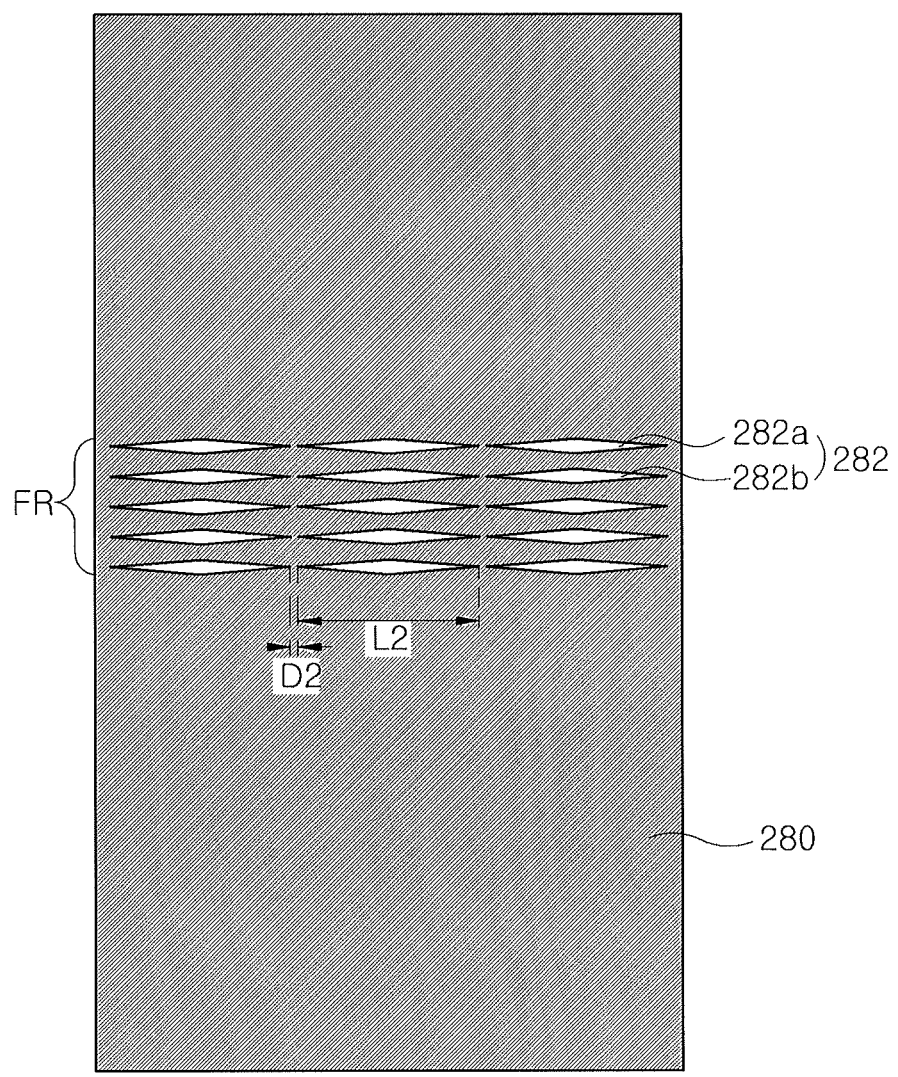

Referring to FIG. 5B, in the folding region FR of the backplate 280, the opening pattern 280 including a first pattern 282a arranged in a (2n−1)th row (e.g., an odd row) and a second pattern 282b arranged in a (2n)th row (e.g., an even row) is formed. (n is a positive integer)

In FIG. 5B, the folding region FR is positioned at a center of the backplate 280. However, a position of the folding region FR is not limited. In addition, at least two folding regions FR may be defined.

Each of the first and second patterns 282a and 282b has a diamond shape. The first pattern 282a in the (2n−1)th row may correspond to the second pattern 282b in the (2n)th row. The first and second patterns 282a and 282b are arranged to be spaced apart from each other. For example, the first patterns 282a in the (2n−1)th row are spaced apart from each other, and the second patterns 282b in the (2n)th row are spaced apart from each other. In addition, the first pattern 282a in the (2n−1)th row and the second pattern 282b in the (2n)th row are spaced apart from each other.

Each of the first and second patterns 282a and 282b is separated by a second distance D2 along the row direction has a second length L2. The second distance D2 is equal to or smaller than the second length L2. It is preferred that the second distance D2 is smaller than the second length L2.

Accordingly, the backplate 280 in folding region FR, where the opening pattern 282 is formed, has the spring-like function in the unfolding operation such that an elastic restoration energy of the backplate 280 is increased. Accordingly, the unfolding speed of the foldable display device 100 is increased.

Figure 5C:
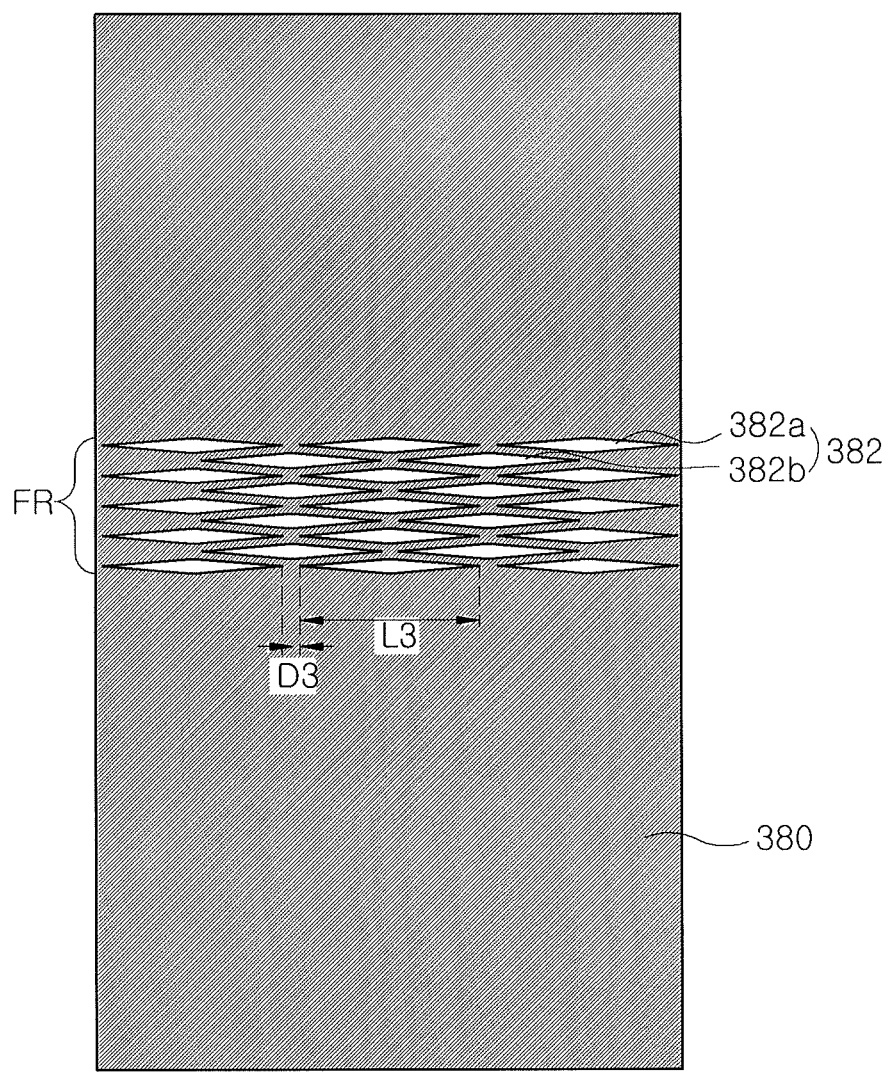

Referring to FIG. 5C, in the folding region FR of the backplate 380, the opening pattern 380 including a first pattern 382a arranged in a (2n−1)th row (e.g., an odd row) and a second pattern 382b arranged in a (2n)th row (e.g., an even row) is formed. (n is a positive integer)

In FIG. 5C, the folding region FR is positioned at a center of the backplate 380. However, a position of the folding region FR is not limited. In addition, at least two folding regions FR may be defined.

Each of the first and second patterns 382a and 382b has a diamond shape. The first pattern 382a in the (2n−1)th row may correspond to a space between adjacent two second patterns 382b in the (2n)th row. For example, a center of the first pattern 382a may correspond to the space between adjacent two second patterns 382b, and a center of the second pattern 382b may correspond to a space between adjacent two first patterns 382a.

Each of the first and second patterns 382a and 382b is separated by a third distance D3 along the row direction has a third length L3. The third distance D3 is equal to or smaller than the third length L3. It is preferred that the third distance D3 is smaller than the third length L3.

Accordingly, the backplate 380 in folding region FR, where the opening pattern 382 is formed, has the spring-like function in the unfolding operation such that an elastic restoration energy of the backplate 380 is increased. Accordingly, the unfolding speed of the foldable display device 100 is increased.

Figure 5D:
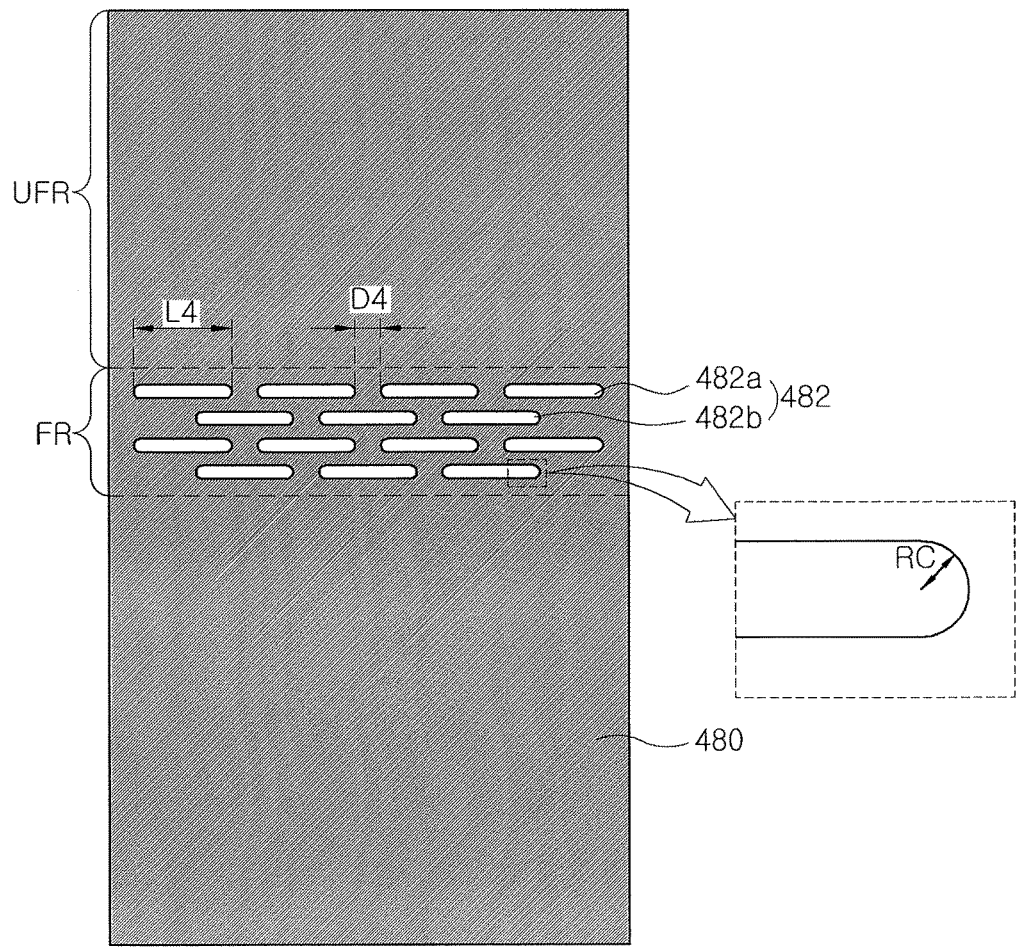

Referring to FIG. 5D, in the folding region FR of the backplate 480, the opening pattern 480 including a first pattern 482a arranged in a (2n−1)th row (e.g., an odd row) and a second pattern 482b arranged in a (2n)th row (e.g., an even row) is formed. (n is a positive integer)

In FIG. 5D, the folding region FR is positioned at a center of the backplate 480. However, a position of the folding region FR is not limited. In addition, at least two folding regions FR may be defined.

Each of the first and second patterns 482a and 482b has an oval-like shape having a constant minor axis length. Namely, each of the first and second patterns 482a and 482b has a shape where a semi-circle is combined to both ends of a rectangular center.

In addition, The first pattern 482a in the (2n−1)th row may correspond to a space between adjacent two second patterns 482b in the (2n)th row. For example, a center of the first pattern 482a may correspond to the space between adjacent two second patterns 482b, and a center of the second pattern 482b may correspond to a space between adjacent two first patterns 482a.

Each of the first and second patterns 482a and 482b is formed to extend along the row direction. Namely, each of the first and second patterns 482a and 482b has a major axis along the row direction. Each of the first and second patterns 482a and 482b is separated by a fourth distance D4 along the row direction has a fourth length L4. The fourth distance D4 is equal to or smaller than the fourth length L4. It is preferred that the fourth distance D4 is smaller than the fourth length L4. In addition, the semi-circle in the end of each of the first and second patterns 482a and 482b has a pre-determined radius of curvature (RC).

Accordingly, the backplate 480 in folding region FR, where the opening pattern 482 is formed, has the spring-like function in the unfolding operation such that an elastic restoration energy of the backplate 480 is increased. Accordingly, the unfolding speed of the foldable display device 100 is increased.

In FIGS. 5A to 5D, the opening pattern has a rectangular shape, a diamond shape or an oval-like shape, but it is not limited thereto. For example, the opening pattern may have a circle shape, an oval shape, a square shape or a trapezoid shape.

Figure 6:
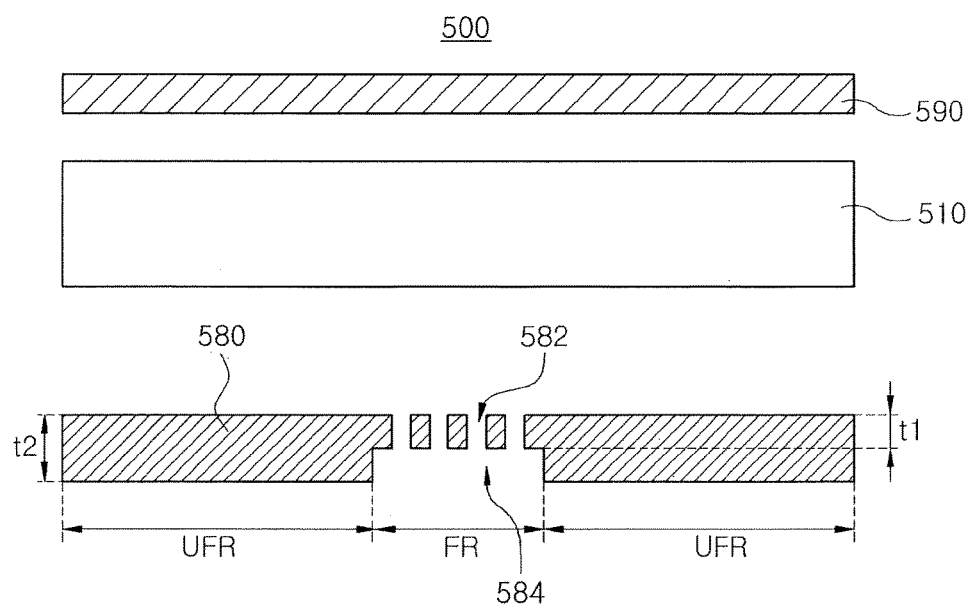
FIG. 6 is a schematic cross-sectional view of a foldable display device according to an embodiment of the present invention.

FIG. 6 is a schematic cross-sectional view of a foldable display device according to an embodiment of the present invention.

As illustrated in FIG. 6, a foldable display device 500 according to an embodiment of the present invention includes a display panel 510, a backplate 580, which is disposed under the display panel 510 and includes at least two opening patterns 582 in a folding region FR, and a cover window 590 disposed on the display panel 510. Namely, the backplate 580 includes two or more holes in the folding region FR.

Although not shown, the display panel 510 includes a flexible substrate and a display part on the flexible substrate. For example, the flexible substrate may be a polyimide substrate, and the display part may be an organic emitting diode.

The backplate 580 is disposed under the display panel 510 such that the display panel 510 is supported by the backplate 580. For example, the backplate 580 may be attached to the display panel 510 using an adhesive layer (not shown).

The backplate 580 has a high stiffness than the flexible substrate of the display panel 510. Namely, the backplate 580 has a Young's modulus value (i.e., elastic modulus value) larger than the flexible substrate.

In the foldable display device 500, the backplate 580 has a first thickness t1 in the folding region FR and a second thickness t2, which is greater than the first thickness t1, in the unfolding region UFR at both sides of the folding region FR. Namely, a concave portion 584 is formed in backplate 580 in the folding region FR.

For example, when the backplate 580 has the first thickness t1 in both the folding region FR and the unfolding region UFR, the folding property in the folding region FR can be satisfied but there is a problem in the support of the display panel 510 in the unfolding region UFR because the stiffness of the backplate 580 is reduced.

On the other hand, when the backplate 580 has the second thickness t2 in both the folding region FR and the unfolding region UFR, there is a problem in the folding property in the folding region FR.

However, in the foldable display device 500 according to an embodiment of the present invention, since the backplate 580 has a relatively large thickness (e.g., the second thickness t2) in the unfolding region UFR and a relatively small thickness (e.g., the first thickness t1) in the folding region FR, both the stiffness and the folding property of the backplate 580 can be satisfied.

In addition, in the foldable display device 500 according to an embodiment of the present invention, since the backplate 580 includes at least two opening patterns (or holes) 582 at the folding region FR, the elastic deformation region of the backplate 580 is enlarged or expanded. The opening pattern 582 is positioned in the concave portion 584 of the backplate 580. The opening patterns 582 at the folding region FR serves as a spring such that the restoration characteristic of the backplate 580 can be improved.

The shape or the arrangement of the opening pattern 582 can be variously modified as shown in FIGS. 5A to 5D.

For example, when the first and second patterns 482a and 482b have an oval-like shape having a constant minor axis length as shown in FIG. 5D, the diameter of the semi-circle in the end of the first and second patterns 482a and 482b is equal to the first thickness t1 of the backplate 580 in the folding region FR or is smaller than one and half times the first thickness t1, (t1≤2RC≤1.5*t1). As a result, with sufficient stiffness, the folding property of the backplate 580 can be improved.

An etching process is performed to form the concave portion 584 and the opening pattern 582. Namely, a first etching process is performed to the concave portion 584 to reduce a thickness of the backplate 580 in the folding region FR, and a second etching process is performed to the opening pattern 582.

In FIG. 6, the foldable display device 500 is folded toward the side of the cover window 590. Namely, when the foldable display device 500 is folded, the backplate 580 is disposed at an outer side and the concave portion 584 is disposed at an outer surface of the backplate 580.

Alternatively, the foldable display device 500 may be folded toward the side of the backplate 580. In this instance, the concave portion 584 may be formed at an inner surface of the backplate 580. Namely, the concave portion 584 may be formed at a surface facing the display panel 510.

Figure 7A:
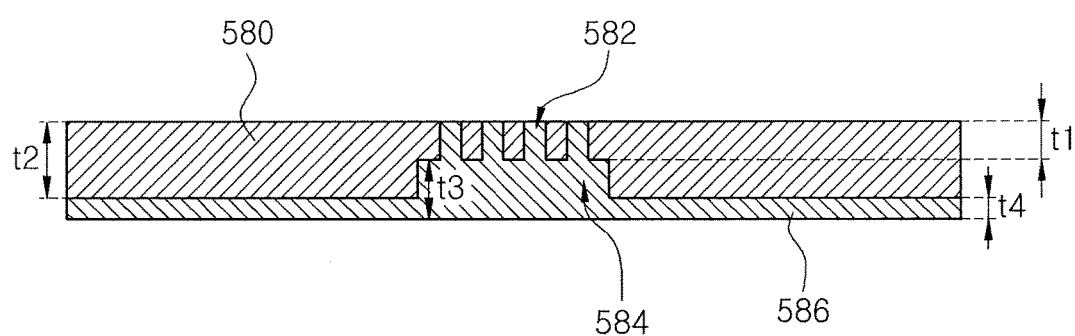
FIGS. 7A to 7C are schematic cross-sectional views of backplates for a foldable display device according to the embodiment of the present invention.
Figure 7B:
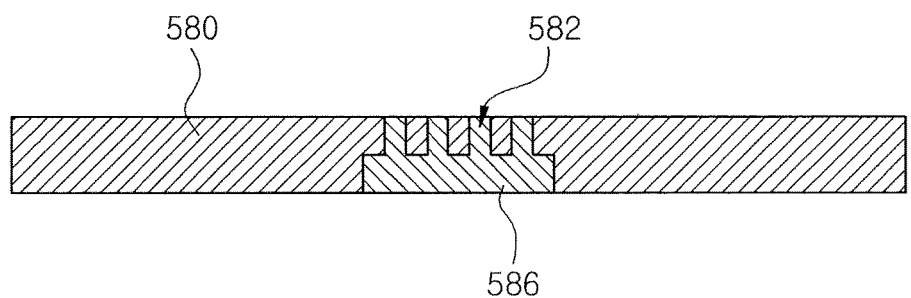
Figure 7C:
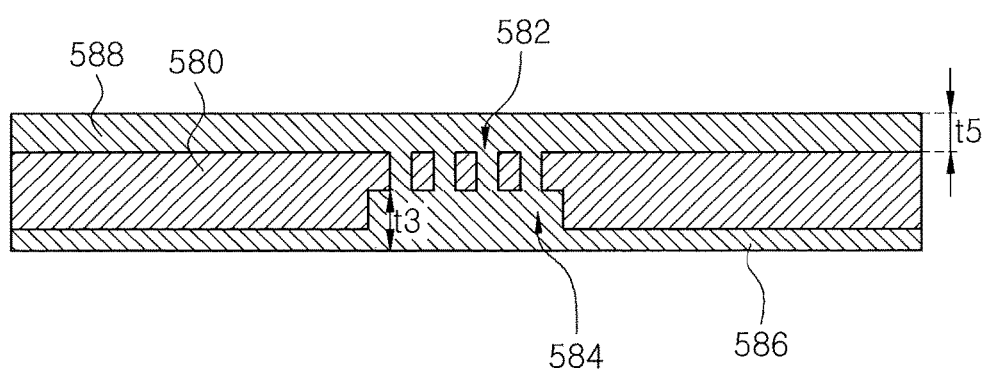

FIGS. 7A to 7C are schematic cross-sectional views of backplates for a foldable display device according to an embodiment of the present invention.

Referring to FIG. 7A, a first step compensation layer 586 may be formed at a side of the backplate 580. The first step compensation layer 586 is disposed at a surface of the backplate 580 including the concave portion 584.

Accordingly, the first step compensation layer 586 has a third thickness t3 in the folding region FR and a fourth thickness t4, which is smaller than the third thickness t3, in the unfolding region UFR.

Referring to FIG. 7B, a first step compensation layer 586 may be formed only in the concave portion 584. Namely, the first step compensation layer 586 forms a flat top surface with the backplate 580.

Referring to FIG. 7C, first and second step compensation layers 586 and 588 may be formed at opposite sides of the backplate 580, respectively. The first step compensation layer 586 is formed at a surface of the backplate 580, where the concave portion 584 is formed, and the second step compensation layer 588 is formed at an opposite surface of the backplate 580. In this instance, the second step compensation layer 588 has an uniform fifth thickness t5. The fifth thickness t5 of the second step compensation layer 588 may be smaller than the third thickness t3 and larger than the fourth thickness t4 such that the backplate 580 has a compressive state in the folding state. Accordingly, the folding/unfolding property of the foldable display device 500 can be further improved.

Each of the first and second step compensation layers 586 and 588 is formed of a material having a low stiffness than the backplate 580 such that the stress applied to the backplate 580 by the folding operation is compensated or relaxed. For example, each of the first and second step compensation layers 586 and 588 may be formed of one of polyurethane (PU), thermoplastic polyurethane (TPU), polyacrylate, rubber and silicon (Si). Namely, each of the first and second step compensation layers 586 and 588 has a Young's modulus value (i.e., elastic modulus value) larger than the backplate 580.

The first and second step compensation layers 586 and 588 cover and protect the opening patterns 582, and the step by the opening patterns 582 is removed by the first and second step compensation layers 586 and 588. Accordingly, an image defect resulted from the step of the opening patterns 582 can be reduced or prevented.

On the other hand, since the first step compensation layer 586 and the backplate 580 are formed of different materials, a boundary between the first step compensation layer 586 and the backplate 580 in an end of the concave portion 584 may be observed by the viewer. Namely, the image quality of the foldable display device may be degraded by a difference in refractive index of the different materials of first step compensation layer 586 and the backplate 580.

To address this problem, the end (e.g., an edge) of the concave portion 584 (e.g., a boundary between first step compensation layer 586 and the backplate 580) corresponds to a boundary of adjacent pixel regions in the display panel. For example, the end of the concave portion 584 may correspond to the bank 166 (of FIG. 4A) or the black matrix 254 (of FIG. 4B).

Figure 8A:
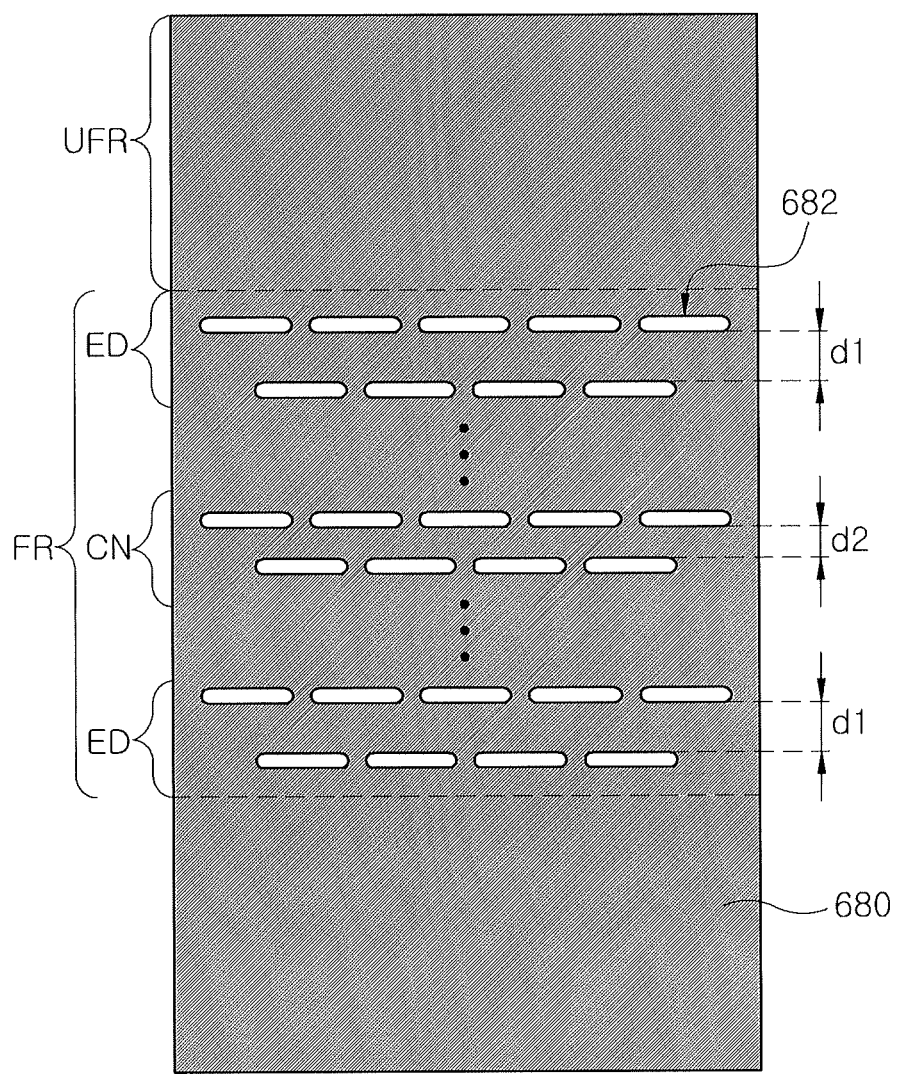
FIGS. 8A to 8C are schematic views illustrating backplates for a foldable display device according to an embodiment of the present invention.
Figure 8B:
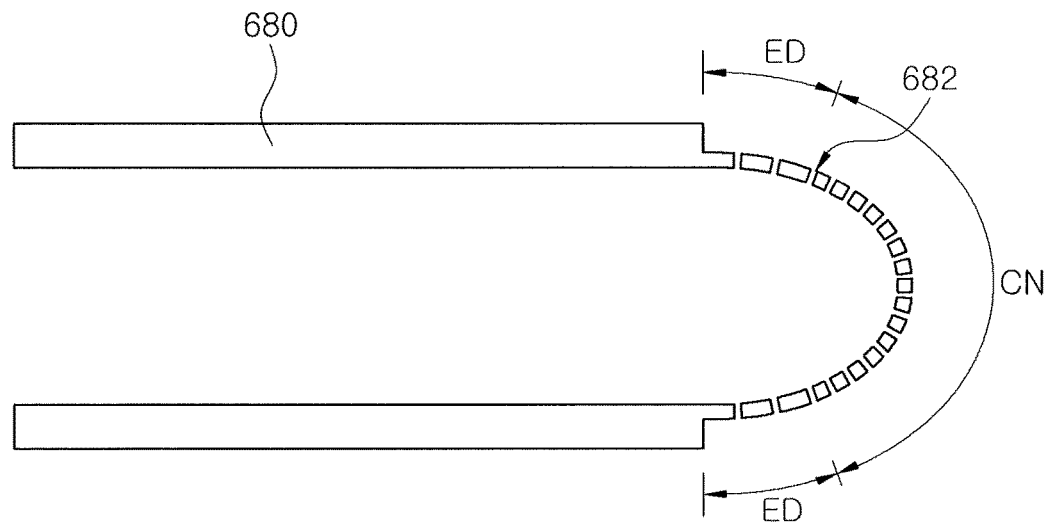
Figure 8C:
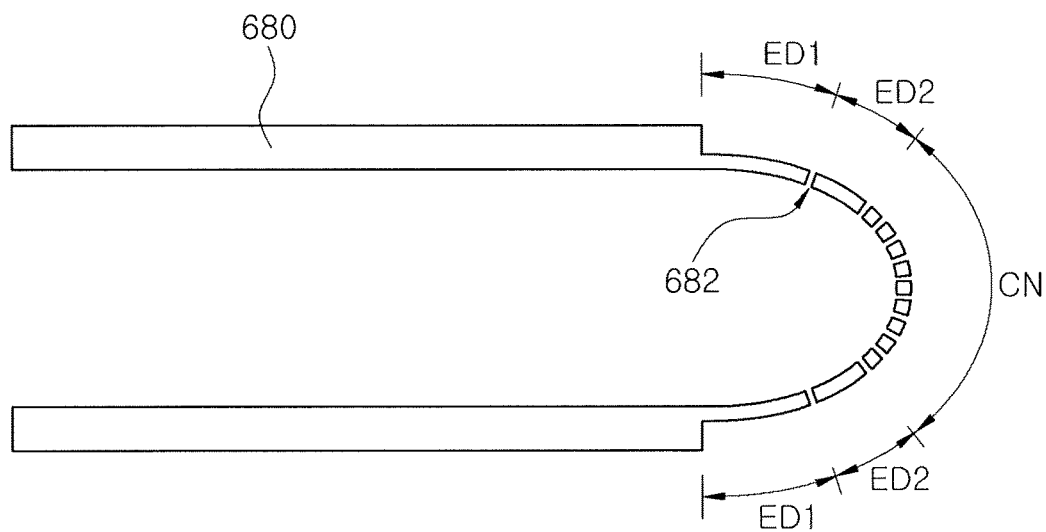

FIGS. 8A to 8C are schematic views illustrating backplates for a foldable display device according to an embodiment of the present invention.

As illustrated in FIG. 8A, a folding region FR and an unfolding region UFR are defined in the backplate 680, and the folding region FR includes a center portion CN and an edge portion ED. An opening pattern 682, which is formed in the folding region FR, has the same size and has a difference in a distance. Namely, a pitch variable opening patterns 682 are formed in the folding region FR of the backplate 680.

With respect to a folding direction, the opening patterns 682 in the edge portion ED are arranged with a first distance d1, and the opening patterns 682 in the center portion CN are arranged with a second distance d2 being smaller than the first distance d1.

Referring to FIG. 8B, which illustrates the backplate 680 in a folding state, with a distance variable opening patterns 682, the backplate 680 has a first curvature radius in the edge portion ED of the folding region FR (of FIG. 8A) and a second curvature radius, which is smaller than the first curvature radius, in the center portion CN of the folding region FR.

Referring to FIG. 8C, the folding region FR may include a center portion CN, a first edge portion ED1 and a second edge portion ED2 between the center portion CN and the first edge portion ED2. In this instance, with respect to the folding direction, the opening patterns 682 in the first edge portion ED1 are arranged with a first distance, the opening patterns 682 in the center portion CN are arranged with a second distance, and the opening patterns 682 in the second edge portion ED2 are arranged with a third distance being larger than the second distance and smaller than the first distance.

With respect to the folding direction, the distance between adjacent opening patterns 682 may be gradually decreased from the edge to the center.

The stress is concentrated in a curvature-starting point (i.e., the edge portion ED or the first edge portion ED1) such that the display panel may be damaged in the curvature-starting point. In the foldable display device according to an embodiment of the present invention, the distance between adjacent opening patterns 682 formed in the folding region FR of the backplate 680 is controlled such that the curvature radius in the curvature-starting point (or a folding-starting point) is increased. As a result, the stress on the display device in the curvature-starting point can be decreased or relaxed such that damages on the display panel can be reduced or prevented.

Figure 9A:
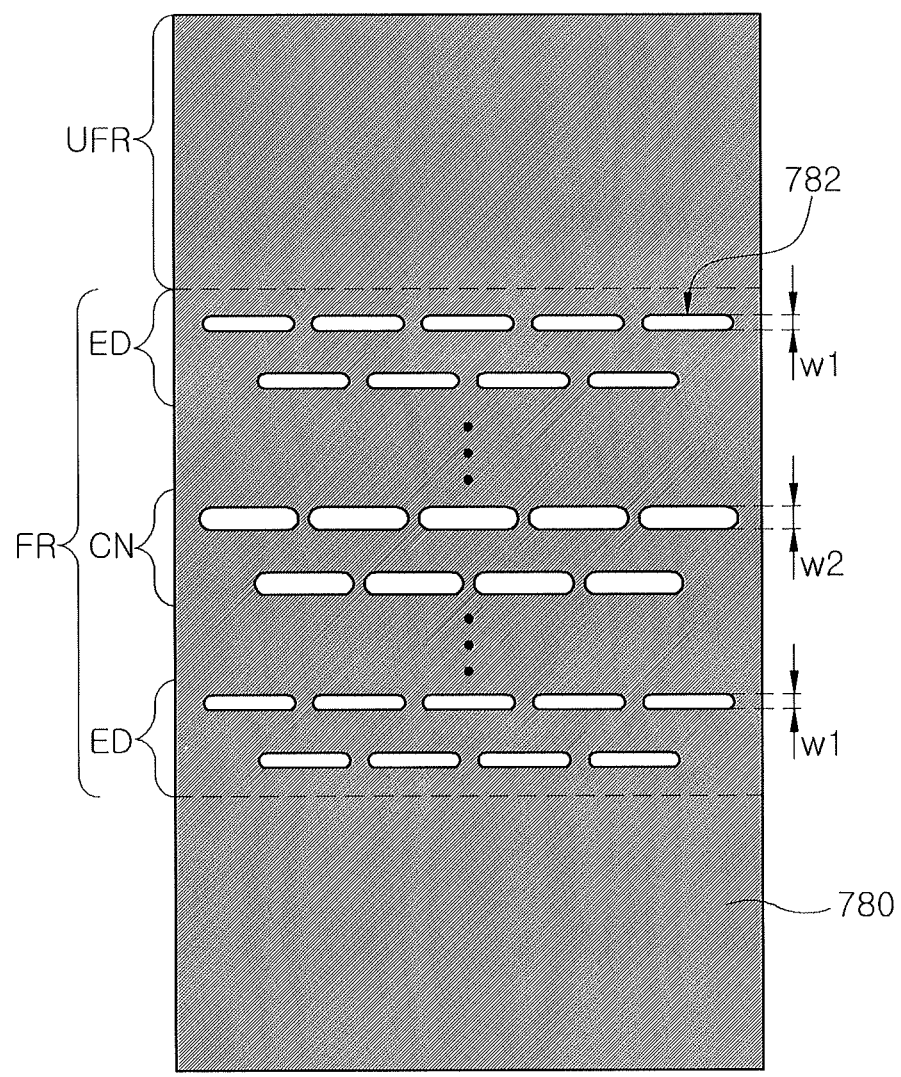
FIGS. 9A to 9C are schematic views illustrating backplates for a foldable display device according to an embodiment of the present invention.
Figure 9B:
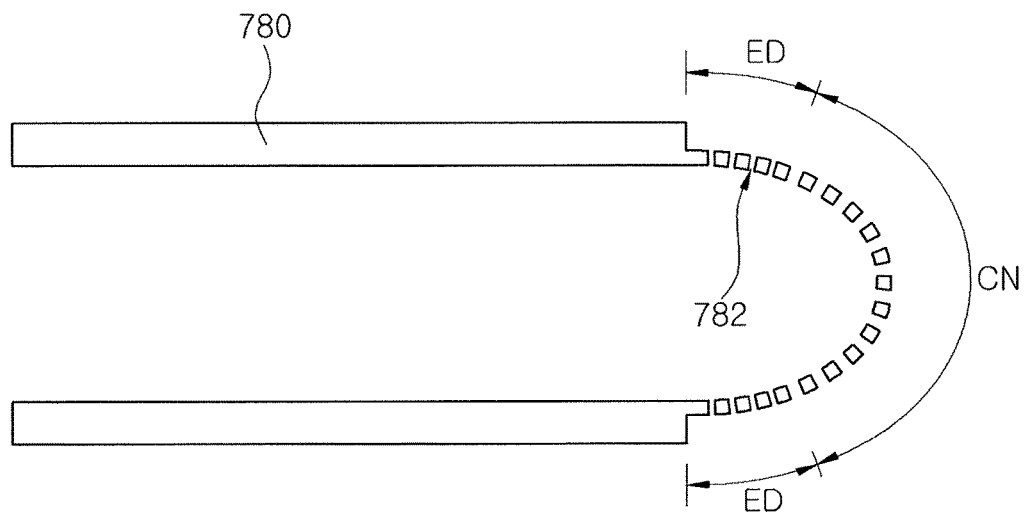
Figure 9C:
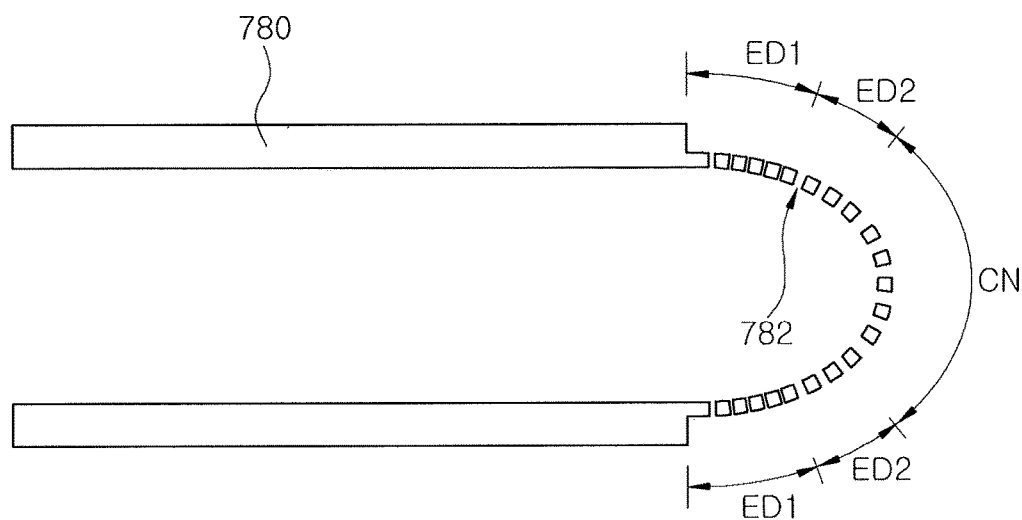

FIGS. 9A to 9C are schematic views illustrating backplates for a foldable display device according to an embodiment of the present invention.

As illustrated in FIG. 9A, a folding region FR and an unfolding region UFR are defined in the backplate 780, and the folding region FR includes a center portion CN and an edge portion ED. An opening pattern 782, which is formed in the folding region FR, are arranged with a constant distance and has a difference in size. Namely, a size variable opening patterns 782 are formed in the folding region FR of the backplate 780.

With respect to a folding direction, the opening pattern 782 in the edge portion ED has a first width w1, and the opening pattern 782 in the center portion CN has a second width w2 being larger than the first width w1.

Referring to FIG. 9B, which shows the backplate 780 in a folding state, with a size variable opening patterns 782, the backplate 780 has a first curvature radius in the edge portion ED of the folding region FR (of FIG. 9A) and a second curvature radius, which is smaller than the first curvature radius, in the center portion CN of the folding region FR.

Referring to FIG. 9C, the folding region FR may includes a center portion CN, a first edge portion ED1 and a second edge portion ED2 between the center portion CN and the first edge portion ED2. In this instance, with respect to the folding direction, the opening pattern 782 in the first edge portion ED1 has a first width, the opening pattern 782 in the center portion CN has a second width, and the opening pattern 782 in the second edge portion ED2 has a third width being larger than the first width and smaller than the third width.

With respect to the folding direction, the size of the opening pattern 782 may be gradually increased from the edge to the center.

In the foldable display device according to an embodiment of the present invention, the size of the opening pattern 682 formed in the folding region FR of the backplate 780 is controlled such that the curvature radius in the curvature-starting point (or a folding-starting point) is increased. As a result, the stress on the display device in the curvature-starting point is decreased or relaxed such that damages on the display panel can be reduced or prevented.

In FIGS. 8A to 8C and 9A to 9C, the distance between adjacent opening patterns or the size of the opening pattern is controlled in the backplate including the concave portion 584 (of FIG. 7A). Alternatively, the backplate may have an uniform thickness without the concave portion.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A foldable display device, comprising:
a display panel;
a cover window on a first side of the display panel;
a touch panel between the cover window and the display panel; and
a backplate on a second surface, which is opposite to the first surface, of the display panel, the backplate including a folding region and unfolding regions at both sides of the folding region, the backplate including at least two opening patterns of holes being spaced apart from each other in the folding region.

2. The foldable display device according to claim 1, wherein the at least two opening patterns include at least one first pattern at a (2n−1)th row and at least two second patterns at a (2n)th row, and each of the at least one first pattern corresponds to a space between adjacent two of the at least two second patterns, and wherein n is a positive integer.

3. The foldable display device according to claim 1, wherein the at least two opening patterns include at least one first pattern at a (2n−1)th row and at least one second pattern at a (2n)th row, and the at least one first pattern corresponds to the at least one second pattern, and wherein n is a positive integer.

4. The foldable display device according to claim 1, wherein the at least two opening patterns include a first pattern at a (2n−1)th row and at least two second patterns at a (2n)th row, and a distance between adjacent the at least two second patterns in the (2n)th row is equal to or smaller than a length of each of the at least two second patterns in the (2n)th row, and wherein n is a positive integer.

5. The foldable display device according to claim 1, wherein the at least two opening patterns have one of a rectangular shape, a diamond shape and an oval-like shape having a constant minor axis length.

6. The foldable display device according to claim 1, wherein a side of the backplate in the folding region is discontinuous.

7. The foldable display device according to claim 1, wherein display panel includes a flexible substrate, and the backplate has a Young's modulus value larger than the flexible substrate.

8. The foldable display device according to 1, further comprising a step compensation layer covering the folding region on at least one side of the backplate.

9. The foldable display device according to claim 8, wherein the step compensation layer has a Young's modulus value smaller than the backplate.

10. The foldable display device according to claim 1, wherein the backplate includes a concave portion in the folding region to have a first thickness in the folding region and a second thickness, which is larger than the first thickness, in the unfolding regions.

11. The foldable display device according to claim 10, further comprising a step compensation layer attached on a surface of the backplate where the concave portion is formed.

12. The foldable display device according to claim 10, wherein the display panel includes a plurality of pixel regions, and an edge of the concave portion corresponds to a boundary of adjacent pixel regions.

13. The foldable display device according to claim 10, wherein the display panel is an organic emitting diode panel, and an edge of the concave portion corresponds to a bank covering an edge of a first electrode of an organic emitting diode.

14. The foldable display device according to claim 10, wherein the step compensation layer forms a flat surface with the backplate.

15. The foldable display device according to claim 10, wherein the concave portion is formed at an outer surface of the backplate, and the foldable display device is configured to be folded toward the display panel.

16. The foldable display device according to claim 10, wherein the concave portion is formed at an inner surface of the backplate, and the foldable display device is configured to be folded toward the backplate.

17. The foldable display device according to claim 1, wherein the folding region is divided into an edge portion and a center portion, and wherein the opening patterns in the edge portion are arranged with a first distance, and the opening patterns in the center portion are arranged with a second distance being smaller than the first distance.

18. The foldable display device according to claim 1, wherein a distance between adjacent opening patterns is gradually decreased from an edge of the folding region to a center of the folding region.

19. The foldable display device according to claim 1, wherein the folding region is divided into an edge portion and a center portion, and wherein the opening pattern in the edge portion has a first width, and the opening pattern in the center portion has a second width being larger than the first width.

20. The foldable display device according to claim 1, wherein a size of the opening pattern is gradually increased from an edge of the folding region to a center of the folding region.

21. A foldable display device, comprising:
a display panel;
a backplate on a surface of the display panel, the backplate including a folding region and unfolding regions at both sides of the folding region, the backplate including at least two opening patterns being spaced apart from each other in the folding region and a concave portion in the folding region; and
a step compensation layer on at least one side of the backplate,
wherein the at least two opening patterns and the concave portion are filled with the step compensation layer.

22. The foldable display device according to claim 21, wherein the step compensation layer has a Young's modulus value smaller than the backplate.

23. The foldable display device according to claim 21, wherein the display panel includes a plurality of pixel regions, and an edge of the concave portion corresponds to a boundary of adjacent pixel regions.

24. The foldable display device according to claim 21, wherein the display panel is an organic emitting diode panel, and an edge of the concave portion corresponds to a bank covering an edge of a first electrode of an organic emitting diode.

25. The foldable display device according to claim 21, wherein the step compensation layer forms a flat surface with the backplate.

26. The foldable display device according to claim 21, wherein the concave portion is formed at an outer surface of the backplate, and the foldable display device is configured to be folded toward the display panel.

27. The foldable display device according to claim 21, wherein the concave portion is formed at an inner surface of the backplate, and the foldable display device is configured to be folded toward the backplate.

* * * * *